United States Patent
Cheng et al.

(10) Patent No.: US 6,327,693 B1
(45) Date of Patent: Dec. 4, 2001

(54) INTERCONNECT DELAY DRIVEN PLACEMENT AND ROUTING OF AN INTEGRATED CIRCUIT DESIGN

(76) Inventors: Chung-Kuan Cheng, 4407 Mensha Pl., San Diego, CA (US) 92130; So-Zen Yao, 39586 Benavente Ave., Fremont, CA (US) 94539

( * ) Notice: Subject to any disclaimer, the term of this patent is extended or adjusted under 35 U.S.C. 154(b) by 0 days.

(21) Appl. No.: 09/290,013

(22) Filed: Apr. 8, 1999

(51) Int. Cl.[7] .................................................. G06F 17/50
(52) U.S. Cl. .................. 716/2; 716/5; 716/8; 716/9; 716/12; 716/13; 716/14
(58) Field of Search .................. 716/9, 13, 14, 716/5, 8, 11, 16, 2, 10, 12

(56) References Cited

U.S. PATENT DOCUMENTS

| | | | |
|---|---|---|---|
| 5,072,402 | 12/1991 | Ashtaputre et al. | 716/14 |
| 5,550,748 | 8/1996 | Xiong | 716/13 |
| 5,610,833 | 3/1997 | Chang et al. | 716/11 |
| 5,666,290 | 9/1997 | Li et al. | 716/8 |
| 5,761,076 | 6/1998 | Miki | 716/5 |
| 5,764,954 | 6/1998 | Fuller et al. | 716/16 |
| 5,798,936 | 8/1998 | Cheng | 716/13 |
| 5,818,729 | 10/1998 | Wang et al. | 716/9 |
| 5,838,583 | 11/1998 | Varadarajan et al. | 716/9 |
| 5,847,965 | 12/1998 | Cheng | 716/9 |
| 6,002,857 | * 12/1999 | Ramachandran | 716/14 |
| 6,009,248 | * 12/1999 | Sato et al. | 716/2 |

FOREIGN PATENT DOCUMENTS

0814420A1  12/1997  (EP) .

OTHER PUBLICATIONS

Gunther, B.K.; "The circuit object organisation library"; Computer Architecture Conference, 2000; 1999; pp. 26–33.*

Mathur, A.; Liu, C.L.; "Timing–driven placement for regular architectures"; IEEE Transactions on Computer–Aided Design of Integrated Circuits and Systems; vol. 16 Iss. 6; Jun. 1997.*

Sung–Woo Hur et al., "Timing Driven Maze Routing", Department of Electrical Engineering and Computer Science (MC 154), University of Illinois at Chicago, Apr., 1999 ISPD, pp. 1–15.

Fang–Jou Liu et al., "Design and Implementation of a Global Router Based on a New Layout–Driven Timing Model with Three Poles", 1997 IEEE International Symposium on Circuits and Systems, Jun. 9–12, 1997, Hong Kong, pp. 1548–1551.

John Lillis, et al., "New Performance Driven Routing Techniques With Explicit Area/DelayTradeoff and Simultaneous Wire Sizing", 33rd Design Automation Conference, Jun., 1996, pp. 395–400.

* cited by examiner

Primary Examiner—Matthew Smith
Assistant Examiner—Jibreel Speight
(74) Attorney, Agent, or Firm—Columbia IP Law Group, PC

(57) ABSTRACT

An EDA tool is provided with a placement and routing (P&R) module that optimizes placement and routing of an IC design in an interconnect delay driven manner. The P&R module systematically determines if it can improve (i.e. reduce) interconnect delay of the current critical interconnect routing path by determining if it can improve the interconnect delays of its constituting segments, each interconnecting two pins through a component. For each segment, the P&R module determines if the interconnect delay can be achieved by using different interconnect routing path interconnecting the two pins through the component replaced at a different location, and alternatively, through a logically equivalent component disposed at a different location.

30 Claims, 7 Drawing Sheets

| CEILING | FLOOR | DIST - 1 | DIST - 2 | | DIST - n | |
|---|---|---|---|---|---|---|
| i + 1 | i - 1 | $c_{11}$ | $c_{12}$ | | $c_{1n}$ | ⎱704⎰ ⎱702 |
| i + 2 | i - 2 | $c_{21}$ | $c_{22}$ | | $c_{2n}$ | |
| i + 1 | i - 1 | $c_{31}$ | $c_{32}$ | | $c_{3n}$ | ⎱704⎰ ⎱702 |
| i + 2 | i - 2 | $c_{41}$ | $c_{42}$ | | $c_{4n}$ | |

INTERCONNECT DELAY DRIVEN PLACEMENT AND ROUTING OF AN INTEGRATED CIRCUIT DESIGN

BACKGROUND OF THE INVENTION

1. Field of the Invention

The present invention relates to the field of integrated circuit (IC) design. More specifically, the present invention relates to the optimization of placement and routing for an IC design.

2. Background Information

Over the years, because of the ever increasing complexity of IC designs, IC designers have become more and more reliant on electronic design automation (EDA) tools to assist them in designing ICs. These assistance span the entire design process, from synthesis, placement, routing, to layout verification.

In the art of placement and routing, i.e. placement of components and routing of connections connecting the various components, various techniques are known. For examples, in U.S. Pat. No. 5,818,729, issued to Wang et al, a method and system for placing cells using "quadratic placement" and a "spanning tree" model was disclosed; in U.S. Pat. No. 5,072,402, issued to Ashtaputre et al., a method for routing interconnections using a "channel" approach is disclosed; and in U.S. Pat. No. 5,550,748, issued to Xiong, a method for "delayed" routing, to satisfy timing constraints, using a "region search" approach is disclosed.

In recent years, various techniques for "jointly" performing placement and routing have also become known. For examples, in U.S. Pat. No. 5,798,936, issued to Cheng, a placement method including look ahead for routing congestion was disclosed; in U.S. Pat. No. 5,838,583, issued to Varadarajan et al., a "joint" method for optimizing placement and routing was disclosed; and in U.S. Pat. No. 5,847,965, issued to Cheng, a "joint" area based method for placing and routing an IC was disclosed.

While each of these prior art techniques has its own advantages, they all share at least one common disadvantage in that they do not adequately address the placement and routing need of sub-micron ICs. Increasingly, interconnect delay has become the primary obstacle preventing sub-micron ICs from realizing the full benefit of these ICs' further increase in compactness for their operating speed. Thus, a placement and routing technique that more adequately addresses the need of sub-micron IC designs is desired.

SUMMARY OF THE INVENTION

An EDA tool is provided with a placement and routing (P&R) module that optimizes placement and routing of an IC design in an interconnect delay driven manner. The P&R module systematically determines if it can improve (i.e. reduce) interconnect delays of the critical interconnect routing paths, by determining if it can improve the interconnect delay of each path's constituting segments connecting two pins through a component. For each such segment, the P&R modules determines if the interconnect delay of the segment can be improved by using a different interconnect routing path interconnecting the two pins through the component replaced to a different location, and alternatively through a logically equivalent component placed at a different location.

In one embodiment, the interconnect delay determination for each segment is made by determining the interconnect delays between the source pin and a number of candidate locations, and the interconnect delays between the candidate locations and the destination pin. In one embodiment, in each case, the interconnect delay determination includes determining resistance and capacitance of the candidate source/destination portion of the segment.

In one embodiment, the interconnect delays for the candidate source/destination portions of a segment are determined employing a performance driven routing technique. In each case, the resistance determination includes determining the longitudinal length of the candidate source/destination portion of the segment, and the capacitance determination includes determining the congestion conditions of various interconnect planes and an average inter-wire distance for the interconnect plane where the candidate source/destination portion is disposed. The determined average inter-wire distance is used to look up capacitance contributions of various interconnect plane pairs from a pre-determined capacitance table. The looked up capacitance contributions in turn are used to determined the capacitance in a weighted manner.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, various aspects of the present invention will be described, and various details will be set forth in order to provide a thorough understanding of the present invention. However, it will be apparent to those skilled in the art that the present invention may be practiced with only some or all aspects of the present invention, and the present invention may be practiced without the specific details. In other instances, well known features are omitted or simplified in order not to obscure the present invention.

Parts of the description will be presented using terminology commonly employed by those skilled in the art to convey the substance of their work to others skilled in the art, such as cells, interconnect planes, and so forth. Also, parts of the description will also be presented in terms of operations performed by a computer system, using terms such as tables, data and the like. As well understood by those skilled in the art, these quantities take the form of electrical, magnetic, or optical signals capable of being stored, transferred, combined, and otherwise manipulated through electrical components of a digital system; and the term digital system includes general purpose as well as special purpose data processing machines, systems, and the like, that are standalone, adjunct or embedded.

Various operations will be described as multiple discrete steps performed in turn in a manner that is most helpful in understanding the present invention. However, the order of description should not be construed as to imply that these operations are necessarily performed in the order they are presented, or even order dependent. Lastly, repeated usage of the phrase "in one embodiment" does not necessarily refer to the same embodiment, although it may.

Figure 1:
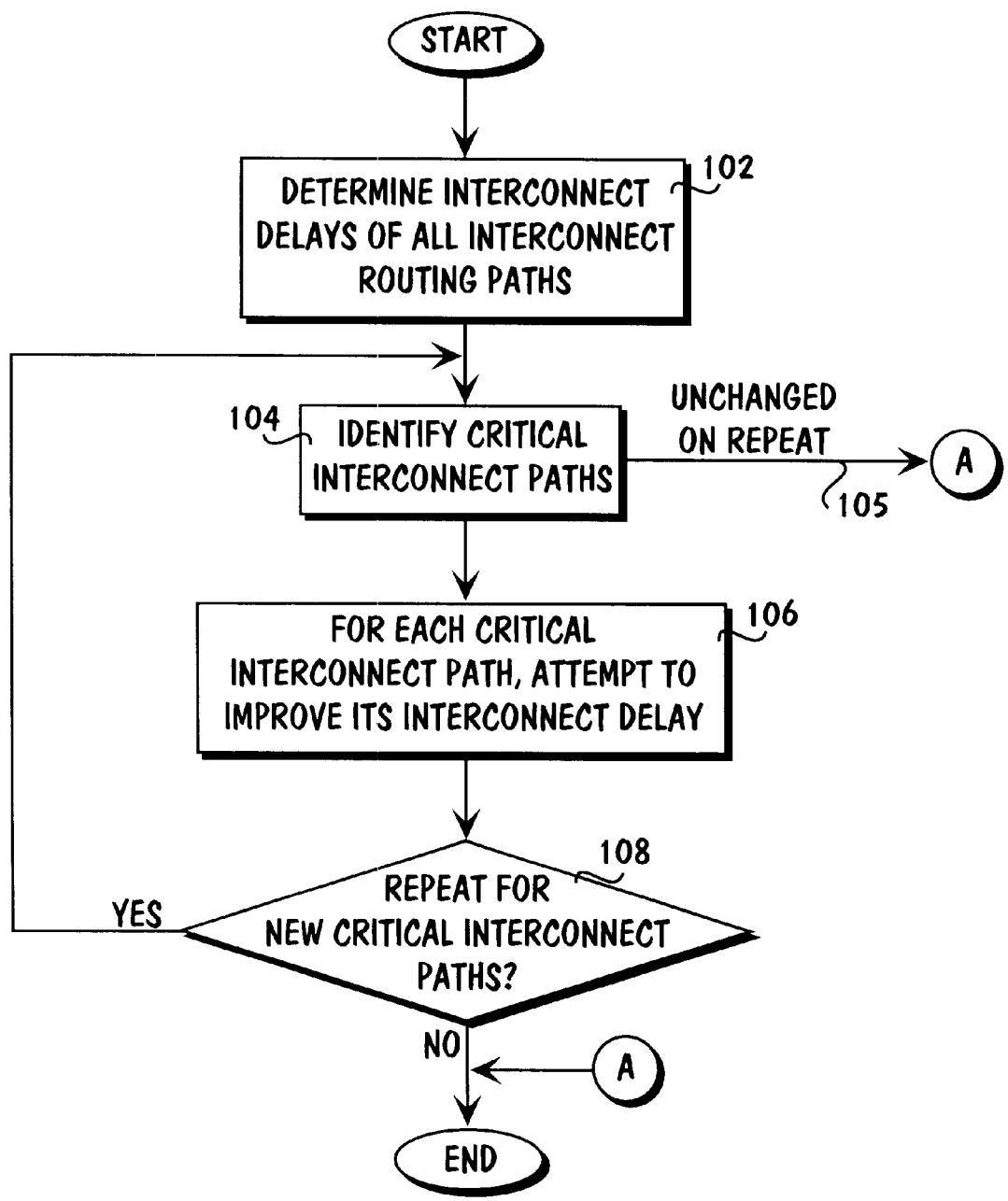
FIG. 1 illustrates an overview of the present invention in accordance with one embodiment.
Figure 10:
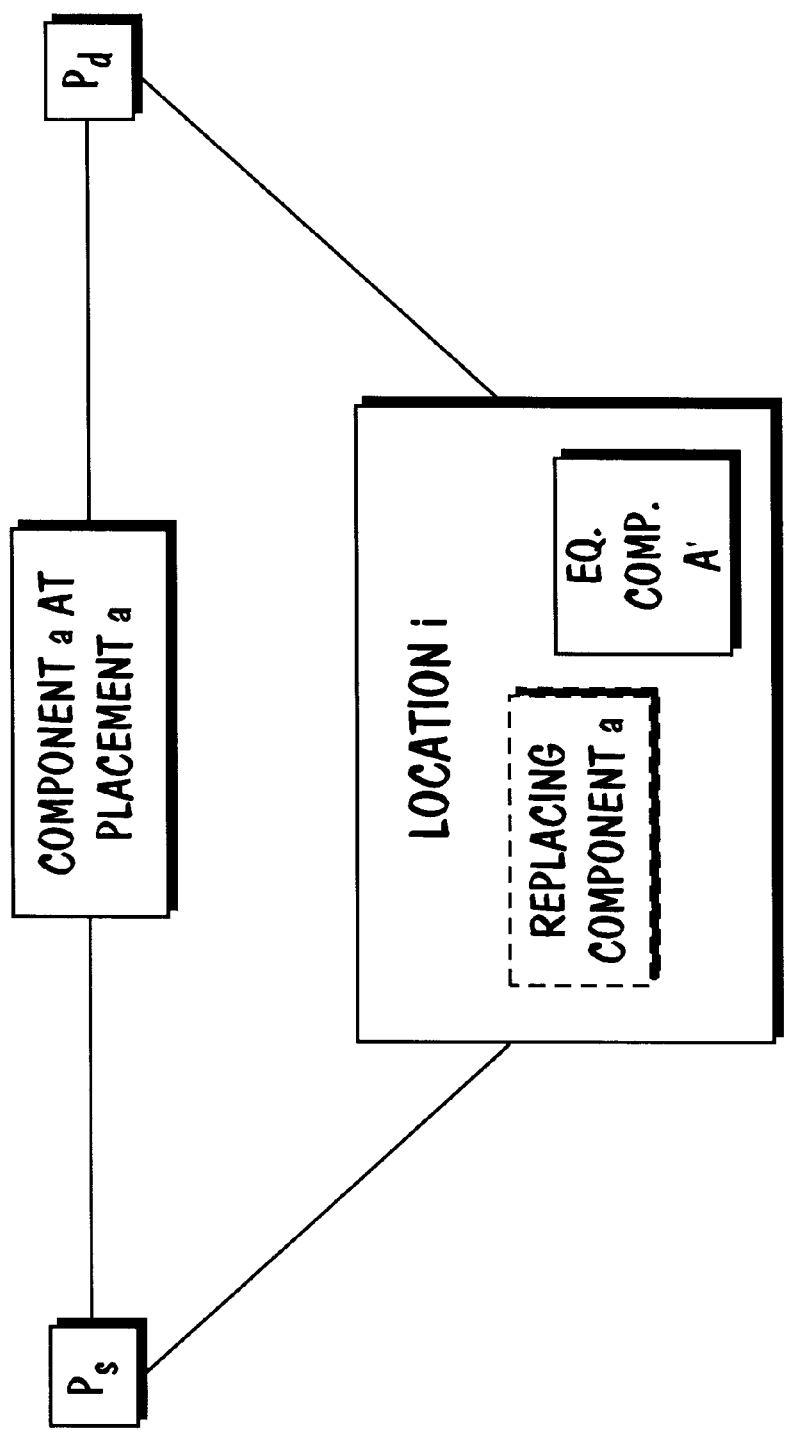
FIG. 10 illustrates an example critical source-destination pin pair interconnected through an intermediate component, and the alternatives considered to improve the interconnect delay between the two pins.

Referring now FIG. 1 which is a block diagram illustrating an overview of the present invention in accordance with one embodiment. As illustrated, in accordance with present invention, a place and route (P&R) module of an EDA tool optimizes placements and routings of an IC design by systematically attempting to improve the interconnect delays of the critical interconnect routing paths. The P&R module attempts to improve the interconnect delay of a critical path by systematically attempting to improve the interconnect delays of the path's constituting segments, each segment interconnecting a source and destination pin pair ($P_s$ and $P_d$) through an intermediate component. In particular, as will be described in more details below, the P&R module attempts to improve the interconnect delay of each source/destination portion of a segment by considering a number of candidate locations, to relocate the intermediate component or to substitute the intermediate component with another logically equivalent component at the candidate location (see FIG. 10).

At block 102, the P&R module determines for a given placement and routing the interconnect delays for all interconnect routing paths or path segments. At block 104, based on the determined interconnect delays for the interconnect routing paths and path segments, the P&R module identifies the critical interconnect paths. In one embodiment, these are interconnect paths incurring interconnect delays in excess of a design criteria. In an alternate embodiment, the critical interconnect paths are interconnect paths incurring the largest interconnect delays. In other embodiments, other definitions may also be employed instead. At block 106, for each of these critical interconnect paths, the P&R module determines if the interconnect delay for the critical interconnect path can be improved. The manner in which the determination is made will be described in more detail below.

For the illustrated embodiment, after each iteration, the P&R module determines if the process is to be repeated. That is, whether the P&R module is being used to reduce the interconnect delays of the critical interconnect paths to a level below a design criteria, or the P&R module is being used to determine the best interconnect delay achievable. In the former case, at block 104, all interconnect paths incurring interconnect delays in excess of the design critiera will be identified as critical interconnect paths. After one iteration, the P&R module simply reports and identifies for the designer, those critical interconnect paths still incurring interconnect delays in excess of the design criteria, such that alternative approaches to reducing their delays may be considered instead. In the later case, at block 104, the interconnect paths incurring the largest interconnect delays are identified as the critical interconnect paths. After each iteration, the P&R module continues at 104 again to identify the critical interconnect paths incurring the largest interconnect delays. If no new critical interconnect path emerges, the P&R module terminates the process, branch 105, as no further improvement can be achieved using the same technique. For example, there were 3 critical interconnect paths, and the interconnect delays for 2 of the paths were improved by 20% while the third one was improved by 10%, and the third one remains to be the only one incurring the largest interconnect delay. However, if at least one new critical interconnect path emerges, the P&R module repeats 106 for the new critical interconnect paths. For example, again if there were 3 critical interconnect paths, and the interconnect delays for 2 of the paths were improved by 20% while the third one was improved by 10%, and the third one along with a fourth interconnect path now incur the largest interconnect delay. The fourth interconnect path is the new critical interconnect path emerged.

Figure 2:
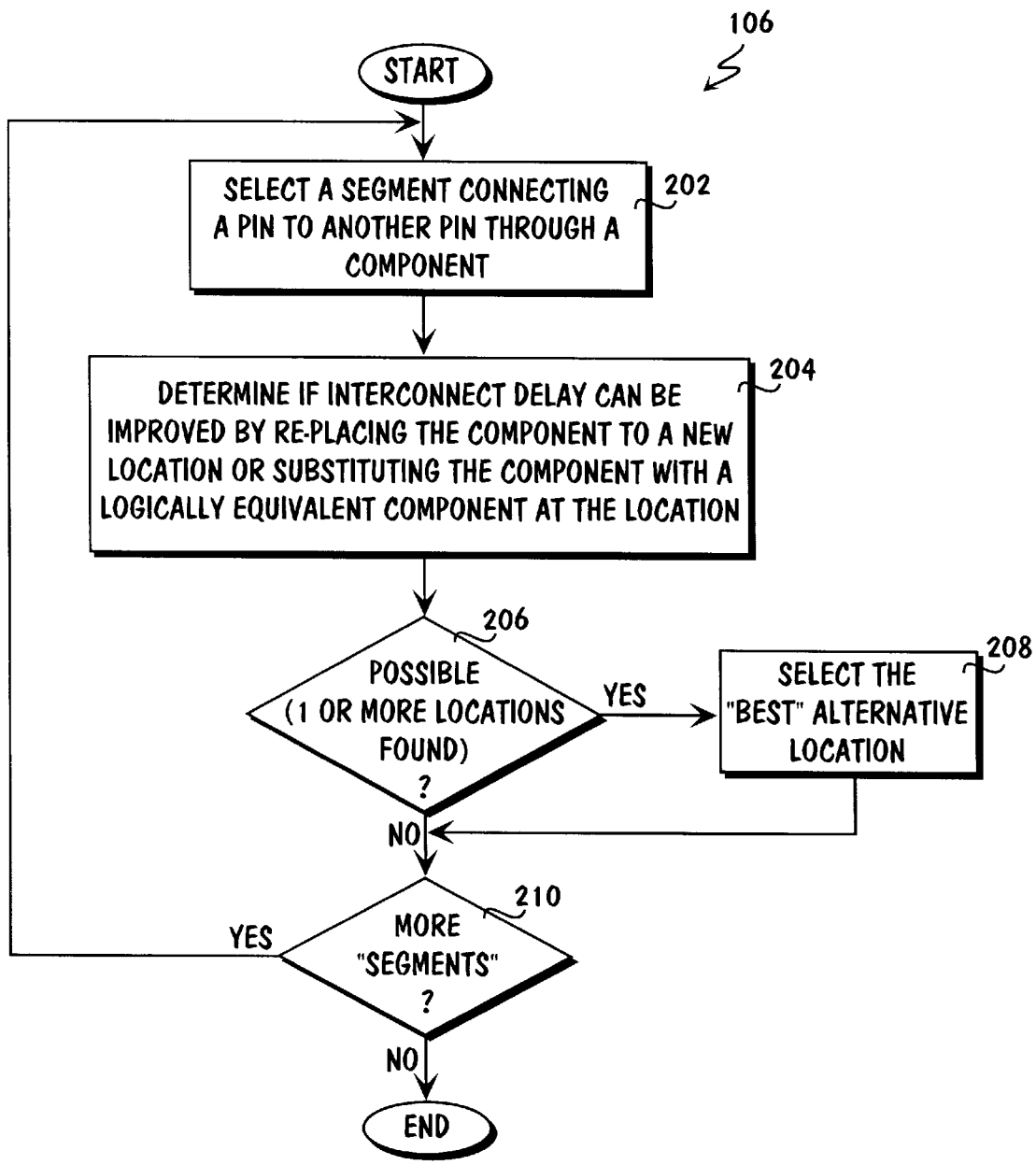
FIG. 2 illustrates interconnect delay determination for an interconnect routing path segment, in accordance with one embodiment.

Referring now to FIG. 2, wherein a block diagram illustrating operation 106 of FIG. 1 in further detail, in accordance with one embodiment, is shown. As illustrated, at 202, the P&R module selects a segment of the critical interconnect path interconnecting a source pin and a destination pin through an intermediate component. At block 204, the P&R module determines if the interconnect delay of the critical interconnect path segment can be improved (i.e. reduced) by using a different route, interconnecting the source and destination pins through the intermediate component re-placed at a different location, and alternatively, through a logically equivalent component disposed at a different location.

At 206, if it is not possible, the process continues with another segment, if there are additional segments. On the other hand, if it is possible, i.e. one or more lower interconnect delay interconnect routing paths exist, at 208, the P&R modules selects one of these alternative interconnect routing paths, based primarily on interconnect delay. In alternate embodiments, other factors such as wire size, and so forth may be considered also. The process continues until eventually improvements for all such segments of the critical interconnect path have been attempted.

Figure 3:
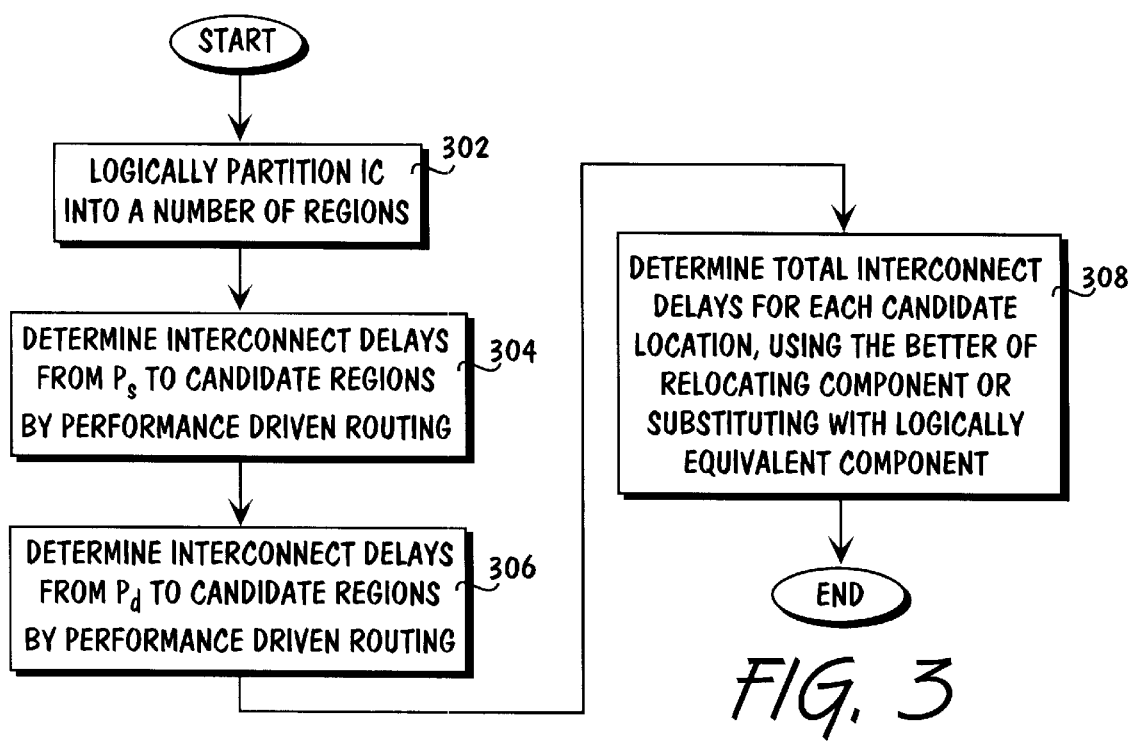
FIG. 3 illustrates determining interconnect delays for alternative interconnect routings, in accordance with one embodiment.

FIG. 3 illustrates operation 204 of FIG. 2 in accordance with one embodiment. As illustrated, at block 302, the P&R module logically partitions the IC into a number of regions (also referred to as locations). At 304, the P&R module determines interconnect delays for various candidate routing alternatives interconnecting the source pin to a number of candidate locations. At 306, the P&R module determines interconnect delays for various candidate routing alternatives interconnecting the destination pin to a number of candidate locations. In various embodiments, the determinations of these interconnect delays, including identification of the candidate locations, are made using various performance driven routing techniques. In one embodiment, the performance driven routing is performed in accordance the approach disclosed in Liu et al., "New Performance Driven Routing Techniques With Explicit Area/Delay Tradeoff and Simultaneous Wiring Sizing", $33^{rd}$ Design Automation Conference, June 1996. In another embodiment, the performance driven routing is performed in accordance the approach disclosed in Liu et al., "Design and Implementation of a Global Router Based on a New Layout-Driven timing Model with Three Poles", IEEE International Symposium on Circuits and Systems, June 1997. In yet another embodiment, the performance driven routing is performed in accordance the approach disclosed in Hur et al., "Timing Driven Maze Routing", International Symposium on Physical Design (ISPD), April 1999. These technical papers are hereby fully incorporated by reference.

At block 308, the P&R module determines the total interconnect delays for the candidate locations. For each candidate location, the P&R sums the interconnect delay incurred for the portion interconnecting the source pin to the location and the interconnect delay incurred for the portion interconnecting the candidate location to the destination pin. Additionally, if it is possible to re-place the component at the candidate location, and there is no logically equivalent component at the candidate location, the P&R module further sums the interconnect delay incurred by the component. However, if it is not possible to re-place the component at the candidate location, but a logically equivalent component exists at the candidate location, the P&R module further sums the interconnect delay incurred by the logically equivalent component. If both options are available, the P&R further sums the smaller of the interconnect delay incurred by the component (re-placed at the candidate location) and the logically equivalent component (disposed at the candidate location), i.e. selecting the better of the two options.

Figure 4:
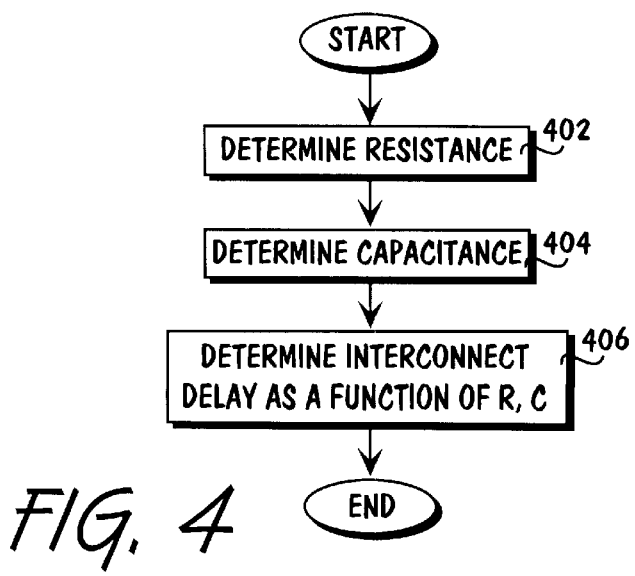
FIG. 4 illustrates interconnect delay determination for a connection in accordance with one embodiment.

FIG. 4 is a block diagram illustrating the determination of interconnect delay for an interconnect routing path segment. As shown, at 402, the P&R module determines the resistance for the interconnect routing path segment. In one embodiment, the resistance of the interconnect routing path segment is determined based primarily on the longitudinal dimension of the interconnect routing path segment. At 404, the P&R module determines the capacitance for the interconnect routing path segment. In one embodiment, the capacitance of the interconnect routing path segment is determined based primarily on the disposition locations of the ceiling and floor dense planes of the interconnect routing path segment and the congestion conditions of these planes, to be described more fully below. At 406, the P&R module determines the interconnect delay for the interconnect routing path segment, using the determined resistance and capacitance for the path segment. In one embodiment, the interconnect delay is determined using the Elmore model. (Note that while resistance is illustrated as being determined before capacitance, the present invention may also be practiced with capacitance being determined first.)

Figure 5:
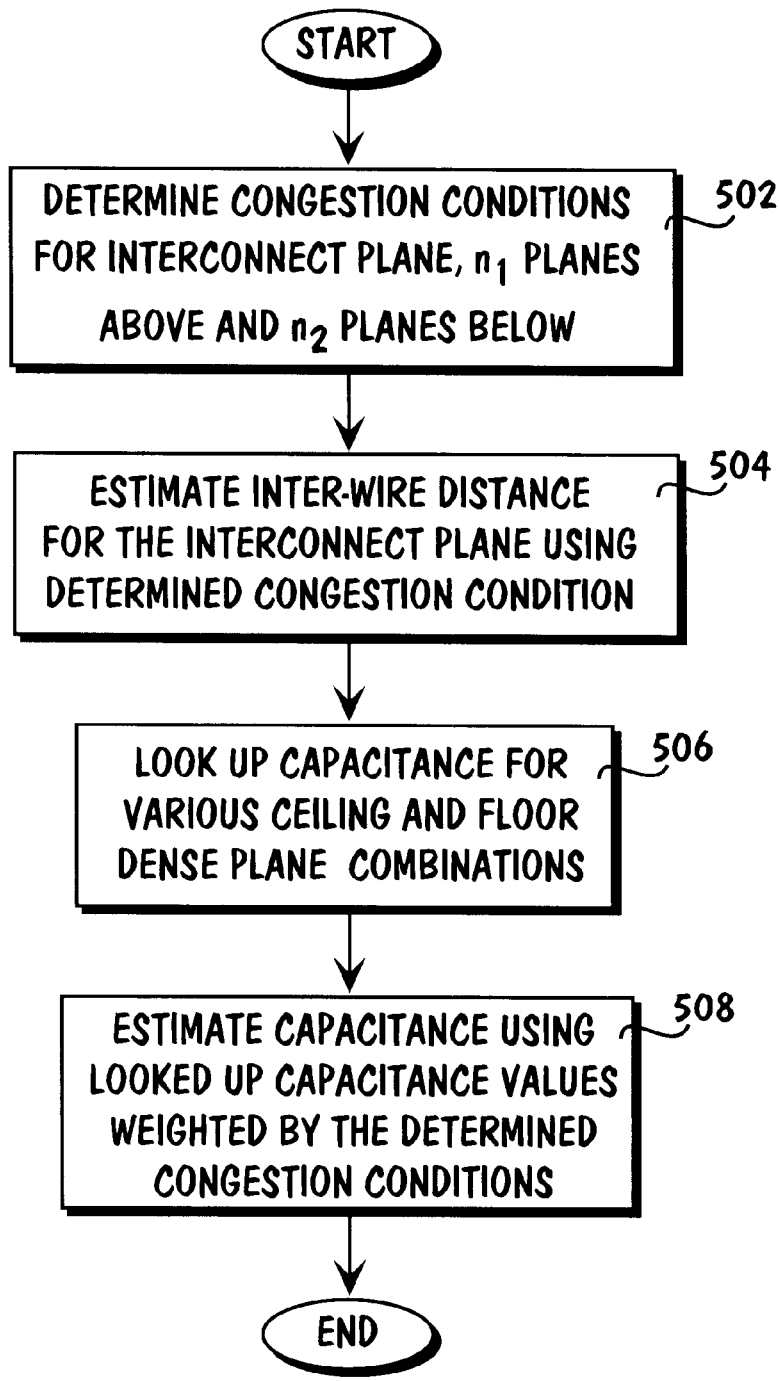
FIG. 5 illustrates capacitance determination for a connection, in accordance with one embodiment.

Referring now to FIG. 5 wherein a block diagram illustrating capacitance determination for an interconnect routing path segment in accordance with one embodiment is shown. As illustrated in FIG. 5, at block 502, the P&R module first determines the congestion conditions of various interconnect planes. In one embodiment, the P&R module determines the congestion conditions of the plane where the path segment is disposed, and two planes above as well as the two planes below, if applicable (i.e. except if the plane where the path segment is disposed is the top most, next to the top most, bottom most or next to the bottom most plane). In one embodiment, the congestion condition is measured in terms of wire density, i.e. amount of wire per unit area. In alternate embodiments, more or less adjacent planes may be considered instead. Then, at block 504, the P&R module estimates the average inter-wire distance for the plane where the path segment is disposed. In one embodiment, the estimation is based on the determined congestion condition, using an empirically determined function. At block 506, the P&R module looks up a number of capacitance values from a predetermined capacitance table using the determined average inter-wire distance, for a number of floor and ceiling dense plane combinations. Finally, at block 508, the P&R module estimates the capacitance value using the capacitance values retrieved from the predetermined capacitance table. In one embodiment, the P&R module makes the estimation in a weight manner. That is, by weighing the retrieved capacitance values by the likelihood of occurrence of the various ceiling and floor dense plane combinations, which is computed from a number of predetermined probability functions, using the determined congestion conditions. For example, in one embodiment, if the determined congestion conditions are 0.7, 0.6, 0.8, 0.5 and 0.3 for planes i+2, i+1, i, i-1 and i-2 respectively, and the retrieved capacitance values for the various dense plane combinations are c1, c2, c3 and c4 for combinations {i+1, i-1}, {i+1, i-2}, {i+2, i-1} and {i+2, i-2} respectively, the capacitance is estimated by summing $0.6 \times 0.5 \times c1 + 0.6 \times (1-0.5) \times c2 + (1-0.6) \times 0.5 \times c3 + (1-0.6) \times (1-0.5) \times c4$. The (1-p) term represents the probability that the ceiling/floor dense plane is not disposed at the i+1/i-1 plane. Other estimation approach may also be employed. The capacitance values stored in the table 700 are empirically determined.

Figures 6, 7:
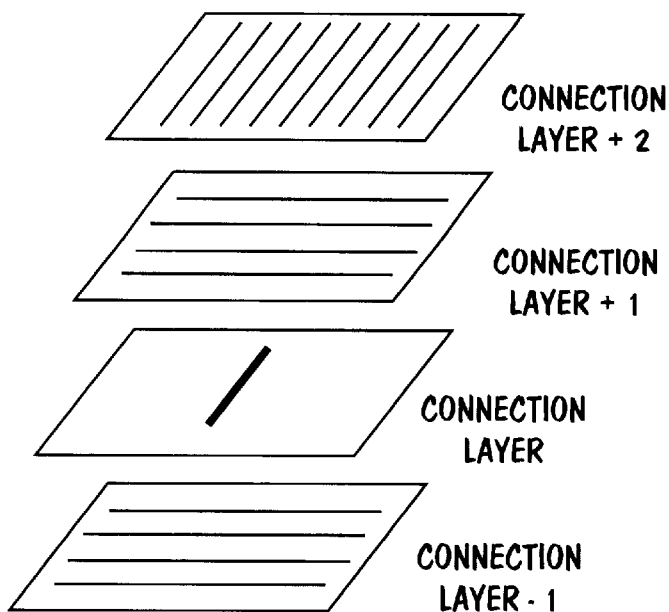
FIG. 6 further illustrates the concept of adjacent congested planes.
FIG. 7 illustrates a capacitance table in accordance with one embodiment.

Referring now to FIG. 6, wherein a perspective view of a multi-layer IC illustrating the concept of floor and ceiling dense planes for an interconnect routing path segment is shown. As illustrated, interconnect routing path segment is disposed on one of the layer (also referred to as an interconnect plane), labeled as "connection layer". The floor and ceiling dense planes are layers or interconnect planes "above" and "below" the connection layer having a congestion level that exceeds a predetermined level. In other words, the ceiling dense plane may be disposed at "connection layer+1", "connection layer+2", and so forth, whereas the floor dense plane may be disposed at "connection layer-1" and so forth. If none of the interconnect layers above the "connection layer" is sufficiently congested, or if the "connection layer" is the top most layer, the interconnect routing path segment is said to have no ceiling dense plane. Similarly, if none of the interconnect layers below the "connection layer" is sufficiently congested, or the "connection layer" is the bottom most layer, the interconnect routing path segment is said to have no floor dense plane.

FIG. 7 illustrates an example capacitance table in accordance with one embodiment. As shown, for the illustrated embodiment, capacitance table 700 is a multi-dimensional table, with multiple two dimensional tables 702 repeated in accordance with where the "ceiling dense plane" is disposed. Each two dimensional table 702 stores multiple rows of capacitance values ($c_{ij}$), 704, one for each corresponding disposition of the floor dense plane. For example, for the "ceiling dense plane" disposed on layer i+1, the capacitance values for the floor dense planes disposed on connection layer i-1 and connection layer i-2 and so forth. Each row 704 stores the capacitance values ($c_{ij}$) for various average inter-wire distances for the particualr ceiling and floor dense plane combination, e.g. planes i+1 and i-1.

Figure 8:
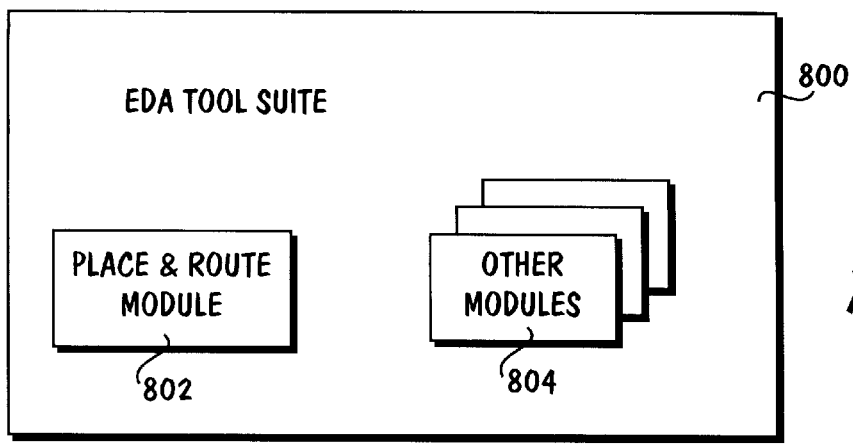
FIG. 8 illustrates an example EDA tool incorporated with the place and route module of the present invention, in accordance with one embodiment.

Referring now to FIG. 8, wherein an EDA tool incorporated with the P&R module of the present invention in accordance with one embodiment is shown. As illustrated, EDA tool suite 800 includes P&R module 802 incorporated with the teachings of the present invention as described earlier with references to FIG. 1–7 and 10. Additionally, EDA tool suite 800 includes other tool modules 804. Examples of these other tool modules 802 include but not limited to synthesis module, layout verification module and so forth.

Figure 9:
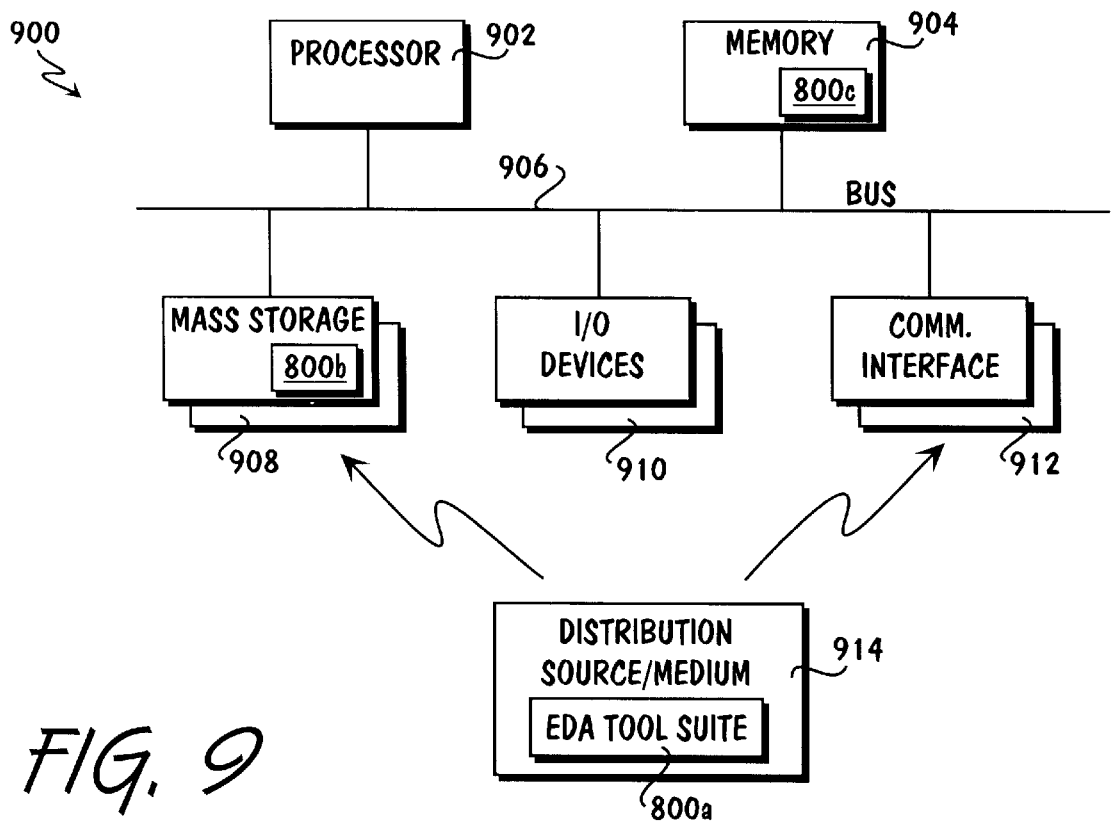
FIG. 9 illustrates an example computer system suitable to be programmed with the programming instructions implementing the EDA tool of FIG. 8.

FIG. 9 illustrates one embodiment of a computer system suitable for use to practice the present invention. As shown, computer system 900 includes processor 902 and memory 904 coupled to each other via system bus 906. Coupled to system bus 906 are non-volatile mass storage 908, such as hard disks, floppy disk, and so forth, input/output devices 910, such as keyboard, displays, and so forth, and communication interfaces 912, such as modem, LAN interfaces, and so forth. Each of these elements perform its conventional functions known in the art. In particular, system memory 904 and non-volatile mass storage 908 are employed to store a working copy and a permanent copy of the programming instructions implementing the above described teachings of the present invention. System memory 904 and non-volatile mass storage 906 may also be employed to store the IC designs. The permanent copy of the programming instructions to practice the present invention may be loaded into non-volatile mass storage 908 in the factory, or in the field, using distribution source/medium 914 and optionally, communication interfaces 912. Examples of distribution medium 914 include recordable medium such as tapes, CDROM, DVD, and so forth. In one embodiment, the programming instructions are part of a collection of programming instructions implementing EDA tool 800 of FIG. 8. The constitution of elements 902–914 are well known, and accordingly will not be further described.

In general, those skilled in the art will recognize that the present invention is not limited to the embodiments described. Instead, the present invention can be practiced with modifications and alterations within the spirit and scope of the appended claims. The description is thus to be regarded as illustrative, instead of restrictive on the present invention.

Thus, a method and an apparatus for optimizing placement and routing of an IC design in an interconnect delay driven manner have been described.

What is claimed is:

1. A computer implemented method for optimizing placement and routing of an integrated circuit design comprising:
    designating a group of critical interconnect routing paths from a plurality of interconnect routing paths in a given region; and
    automatically determining, for each of the designated critical interconnect routing paths, if interconnect delay of a path segment connecting a first pin to a second pin through a component can be reduced by any of a plurality of different paths, said plurality of different paths interconnecting the first pin to the second pin through the component re-placed at a different location, through a logically equivalent component, and through a logically equivalent component placed at a different location; and
    selecting, for each of the designated critical interconnect routing paths, one of the plurality of different paths to interconnect the first pin to the second pin based primarily on an amount of interconnect delay reduction achieved.

2. The method of claim 1, wherein said determining if interconnect delay of a critical interconnect routing path segment connecting a first pin to a second pin through a component can be reduced comprises determining interconnect delays for a first plurality of interconnect routing paths interconnecting the first pin to a plurality of candidate locations, and for a second plurality of interconnect routing paths interconnecting the second pin to the same plurality of candidate locations, using performance driven routing.

3. The method of claim 2, wherein said performance driven routing is performance driven maze routing.

4. The method of claim 2, wherein said determining if interconnect delay of a critical interconnect routing path segment connecting a first pin to a second pin through a component can be reduced further comprises summing the interconnect delays incurred between the first pin and a candidate location to the interconnect delay incurred between the second pin and the same candidate location.

5. The method of claim 4, wherein said determining if interconnect delay of a critical interconnect routing path segment connecting a first pin to a second pin through a component can be reduced further comprises summing the interconnect delay sum to the delay incurred at the re-placed component.

6. The method of claim 4, wherein said determining if interconnect delay of a critical interconnect routing path segment connecting a first pin to a second pin through a component can be reduced further comprises summing the interconnect delay sum to the delay incurred at the logically equivalent component disposed at the candidate location.

7. A computer implemented method for optimizing placement and routing of an integrated circuit design comprising:
    determining if interconnect delay of a critical interconnect routing path segment connecting a first pin to a second pin through a component can be reduced by a different interconnect routing path interconnecting the first pin to the second through the component re-placed at a different location, and alternatively through a logically equivalent component placed at a different location; and
    selecting one of such different interconnect routing paths to interconnect the first pin to the second pin based primarily on the amount of interconnect delay reduction achieved, wherein said determining comprises determining resistance for a plurality of candidate interconnect routings based at least in part on longitudinal distances of the candidate interconnect routings.

8. A computer implemented method for optimizing placement and routing of an integrated circuit design comprising:
    determining if interconnect delay of a critical interconnect routing path segment connecting a first pin to a second pin through a component can be reduced by a different interconnect routing path interconnecting the first pin to the second through the component re-placed at a different location, and alternatively through a logically equivalent component placed at a different location; and
    selecting one of such different interconnect routing paths to interconnect the first pin to the second pin based primarily on the amount of interconnect delay reduction achieved, wherein said determining comprises determining capacitance for a plurality of candidate interconnect routings based at least in part on disposition locations of ceiling and floor dense planes of the candidate interconnect routings.

9. The method of claim 8, wherein said determining of capacitance further comprises looking up capacitance values from a pre-determined capacitance table using a determined average inter-wire distance and various floor and ceiling dense plane combinations.

10. The method of claim 8, wherein said determining of capacitance comprises determining congestion conditions for a plurality of interconnect planes.

11. An article of manufacture comprising:
    a recordable medium having recorded thereon a plurality of programming instructions for use to program a computer system to enable the computer system to be able to optimize placement and routing of an integrated circuit design, including designating a group of critical interconnect routing paths from a plurality of interconnect routing paths in a given region; and automatically determining, for each of the designated critical interconnect routing paths, if interconnect delay of a path segment connecting a first pin to a second pin through a component can be reduced by any of a plurality of different paths, said plurality of different paths interconnecting the first pin to the second pin through the component re-placed at a different location, through a logically equivalent component, and through the logically equivalent component placed at a different location; and selecting, for each of the designated critical interconnect routing paths, one of the plurality of different paths to interconnect the first pin to the second pin based primarily on an amount of interconnect delay reduction achieved.

12. The article of claim 11, wherein said programming instructions further enable the computer system to determine interconnect delays for a first plurality of interconnect routing paths interconnecting the first pin to a plurality of candidate locations, and for a second plurality of interconnect routing paths interconnecting the second pin to the same plurality of candidate locations, using performance driven routing.

13. The article of claim 12, wherein said programming instructions further enable the computer system to perform performance driven maze routing.

14. The article of claim 12, wherein said programming instructions further enable the computer system to sum the interconnect delays incurred between the first pin and a candidate location to the interconnect delay incurred between the second pin and the same candidate location.

15. The article of claim 14, wherein said programming instructions further enable the computer system to further sum the interconnect delay sum to the delay incurred at the re-placed component.

16. The article of claim 14, wherein said programming instructions further enable the computer system to sum the interconnect delay sum to the delay incurred at the logically equivalent component disposed at the candidate location.

17. An article of manufacture comprising:

a recordable medium having recorded thereon a plurality of programming instructions for use to program a computer system to enable the computer system to be able to optimize placement and routing of an integrated circuit design, including determining if interconnect delay of a critical interconnect routing path segment connecting a first pin to a second pin through a component can be reduced by a different interconnect routing path interconnecting the first pin to the second through the component re-placed at a different location, and alternatively through a logically equivalent component placed at a different location; and selecting one of such different interconnect routing paths to interconnect the first pin to the second pin based primarily on the amount of interconnect delay reduction achieved, wherein said programming instructions further enable the computer system to determine resistance for a plurality of candidate interconnect routings based at least in part on longitudinal distances of the candidate interconnect routings.

18. An article of manufacture comprising:

a recordable medium having recorded thereon a plurality of programming instructions for use to program a computer system to enable the computer system to be able to optimize placement and routing of an integrated circuit design, including determining if interconnect delay of a critical interconnect routing path segment connecting a first pin to a second pin through a component can be reduced by a different interconnect routing path interconnecting the first pin to the second through the component re-placed at a different location, and alternatively through a logically equivalent component placed at a different location; and selecting one of such different interconnect routing paths to interconnect the first pin to the second pin based primarily on the amount of interconnect delay reduction achieved, wherein said programming instructions further enable the computer system to determine capacitance for a plurality of candidate interconnect routings based at least in part on disposition locations of ceiling and floor dense planes of the candidate interconnect routings.

19. The article of claim 18, wherein said programming instructions further enable the computer system to look up capacitance values from a pre-determined capacitance table using a determined average inter-wire distance and various floor and ceiling dense plane combinations.

20. The article of claim 18, wherein said programming instructions further enable the computer system to determine congestion conditions for a plurality of interconnect planes.

21. A computer system comprising:

a storage medium having stored therein a plurality of programming instructions;

a processor coupled to the storage medium to execute the programming instructions to optimize placement and routing of an integrated circuit design, including designating a group of critical interconnect routing paths from a plurality of interconnect routing paths in a given region; and automatically determining, for each of the designated critical interconnect routing paths, if interconnect delay of a path segment connecting a first pin to a second pin through a component can be reduced by any of a plurality of different paths, said plurality of different paths interconnecting the first pin to the second pin through the component re-placed at a different location, through a logically equivalent component, and through the logically equivalent component placed at a different location; and selecting, for each of the designated critical interconnect routing paths, one of the plurality of different paths to interconnect the first pin to the second pin based primarily on an amount of interconnect delay reduction achieved.

22. The computer system of claim 21, wherein the processor further executes the programming instructions to determine interconnect delays for a first plurality of interconnect routing paths interconnecting the first pin to a plurality of candidate locations, and for a second plurality of interconnect routing paths interconnecting the second pin to the same plurality of candidate locations, using performance driven routing.

23. The computer system of claim 22, wherein the processor further executes the programming instructions to perform performance driven maze routing.

24. The computer system of claim 22, wherein the processor further executes the programming instructions to sum the interconnect delays incurred between the first pin and a candidate location to the interconnect delay incurred between the second pin and the same candidate location.

25. The computer system of claim 24, wherein the processor further executes the programming instructions to further sum the interconnect delay sum to the delay incurred at the re-placed component.

26. The computer system of claim 24, wherein the processor further executes the programming instructions to sum the interconnect delay sum to the delay incurred at the logically equivalent component disposed at the candidate location.

27. A computer system comprising:
a storage medium having stored therein a plurality of programming instructions;
a processor coupled to the storage medium to execute the programming instructions to optimize placement and routing of an integrated circuit design, including
determining if interconnect delay of a critical interconnect routing path segment connecting a first pin to a second pin through a component can be reduced by a different interconnect routing path interconnecting the first pin to the second through the component re-placed at a different location, and alternatively through a logically equivalent component placed at a different location; and
selecting one of such different interconnect routing paths to interconnect the first pin to the second pin based primarily on the amount of interconnect delay reduction achieved, wherein the processor further executes the programming instructions to determine resistance for a plurality of candidate interconnect routings based at least in part on longitudinal distances of the candidate interconnect routings.

28. A computer system comprising:
a storage medium having stored therein a plurality of programming instructions;
a processor coupled to the storage medium to execute the programming instructions to optimize placement and routing of an integrated circuit design, including
determining if interconnect delay of a critical interconnect routing path segment connecting a first pin to a second pin through a component can be reduced by a different interconnect routing path interconnecting the first pin to the second through the component re-placed at a different location, and alternatively through a logically equivalent component placed at a different location; and
selecting one of such different interconnect routing paths to interconnect the first pin to the second pin based primarily on the amount of interconnect delay reduction achieved, wherein the processor further executes the programming instructions to determine capacitance for a plurality of candidate interconnect routings based at least in part on disposition locations of ceiling and floor dense planes of the candidate interconnect routings.

29. The computer system of claim 28, wherein the processor further executes the programming instructions to look up capacitance values from a pre-determined capacitance table using a determined average inter-wire distance and various floor and ceiling dense plane combinations.

30. The computer system of claim 28, wherein the processor further executes the programming instructions to determine congestion conditions for a plurality of interconnect planes.

* * * * *